United States Patent
Scheibel

(10) Patent No.: US 6,392,608 B2
(45) Date of Patent: May 21, 2002

(54) DEVICE FOR DECREASING THE NUMBER OF ANTENNAS ON A COMBAT VEHICLE

(75) Inventor: Axel Scheibel, Niestetal (DE)

(73) Assignee: Krauss-Maffei-Wegman GmbH & Co. KG, Kassell (DE)

( * ) Notice: Subject to any disclaimer, the term of this patent is extended or adjusted under 35 U.S.C. 154(b) by 0 days.

(21) Appl. No.: 09/832,443

(22) Filed: Apr. 11, 2001

(30) Foreign Application Priority Data

Apr. 27, 2000 (DE) .................... 200 07 619 U

(51) Int. Cl.[7] .............. H01Q 1/32; H01G 1/32
(52) U.S. Cl. ...................... 343/713; 343/711
(58) Field of Search ................ 343/711, 713, 343/712, 714, 715, 716, 717, 873; 342/70

(56) References Cited

U.S. PATENT DOCUMENTS

| | | | |
|---|---|---|---|
| 3,705,385 A | * 12/1972 | Batz | 340/152 R |
| 3,733,431 A | * 5/1973 | Kirk, Jr. et al. | 178/5.1 |
| 4,005,429 A | * 1/1977 | Ikrath et al. | 343/713 |
| 5,335,010 A | * 8/1994 | Lindemeier et al. | 348/706 |
| 5,491,839 A | * 2/1996 | Schotz | 455/66 |
| 6,271,798 B1 | * 8/2001 | Endo et al. | 343/713 |

\* cited by examiner

*Primary Examiner*—Tan Ho
*Assistant Examiner*—James Clinger
(74) *Attorney, Agent, or Firm*—Chadbourne & Parke, LLP

(57) ABSTRACT

A device for decreasing the number of antennas on a combat vehicle that accommodates several communications terminals has a combiner-separator module for coupling each pair of communications terminals to the same antenna. Each module has one master gate for connecting the antenna and two slave gates for connecting the communications terminals, coupled by way of a transformer stage. The gates are direct-current decoupled from the transformer stage and the master gate is connected to each slave gate by way of a bypass that transmits only a direct current and provides an antenna voltage.

4 Claims, 7 Drawing Sheets

DEVICE FOR DECREASING THE NUMBER OF ANTENNAS ON A COMBAT VEHICLE

BACKGROUND OF THE INVENTION

The present invention concerns a device for decreasing the number of antennas on a combat vehicle that accommodates several communications terminals.

The demand for effective communications in military applications has been increasing rapidly quite recently. This demand concerns both the classical stationary communications equipment and mobile communications devices. Because of these developments, it has been necessary to equip contemporary combat vehicles with a number of communications terminals. This equipment not only transmits information in general but also handles communications (data and voice) between individual components of the system. The statistical individuality of the data thereby transmitted makes it impossible to establish an overall format for the traffic between different communications systems. In principle, however, all the radio equipment must be capable of operating parallel, even within a single frequency range when necessary.

Contemporary combat vehicles are usually provided with two separate antennas in the stern. Physical conditions often make it desirable to mount an antenna systems-engineering optimally on the vehicle, although this is impossible when there are several such components.

SUMMARY OF THE INVENTION

The object of the present invention is accordingly a device that will by simple means allow a decrease in the number of antennas on the vehicle and especially the use of only one antenna, which can accordingly be installed optimally from the systems-engineering aspect, instead of two.

Several engineering goals had to be attained here:
 a) non-priority parallel exploitation of a single antenna, with several radios accessing it simultaneously, a slight decrease in range being permissible,
 b) a diplexer capable of transmitting—in accordance with the radio's specifications—a high-frequency signal in the 30–110 MHz range,
 c) high-frequency output with the diplexer forwarding—in accordance with the radio's specifications—50 watts per adapted radio,
 d) high-frequency decoupling of parallel ports, the manufacturer's decoupling specifications being absolutely complied with when several radios are coupled to the same antenna, whereby failure to attain the specifications would lead directly to destruction of the receiver's input stages,
 e) direct-current (antenna-to-radio) coupling, ensuring transmission of 50 volts from the radio to the base of the antenna, this voltage acting as a bias voltage for a diode network to protect the system from lightning, and
 f) direct-current decoupling (radio-from-radio) of the individual radios' 50 V DC current, ensuring suppression of any DC equalizing current by way of the antenna input terminals.

The aforesaid object is attained in accordance with the present invention in that each pair of communications terminals is coupled to the same antenna by way of a combiner-separator module, each module comprising one master gate for connecting the antenna and two slave gates for connecting the communications terminals, coupled by way of a transformer stage, whereby the gates are direct-current decoupled from the transformer stage and the master gate is connected to each slave gate by way of a bypass that transmits strictly a direct current and provides an antenna voltage.

It has been demonstrated of advantage here for the transformer stage to comprise a transformer with one end of its primary coil connected to the master gate by way of a capacitor and the other end connected to zero potential and with both ends of its secondary coil connected to one of the slave gates by way of a capacitor and to zero potential at a branch at the midpoint.

According to the theory basic to the present invention, two communications terminals can be connected to a single antenna by way of a special combiner-separator module, and the aforesaid engineering problems can be solved by providing the module with a passive diplexer modified to comply with the aforesaid specifications.

As will be specified hereinafter with reference to a particular embodiment, the combiner-separator module in accordance with the present invention will easily allow the connection of two communications terminals to a single antenna while still complying with the aforesaid conditions.

One embodiment of a device in accordance with the present invention will now be specified along with the empirically derived characteristics of its circuitry with reference to the accompanying drawing, wherein

DETAILED DESCRIPTION OF THE INVENTION

Figure 1:
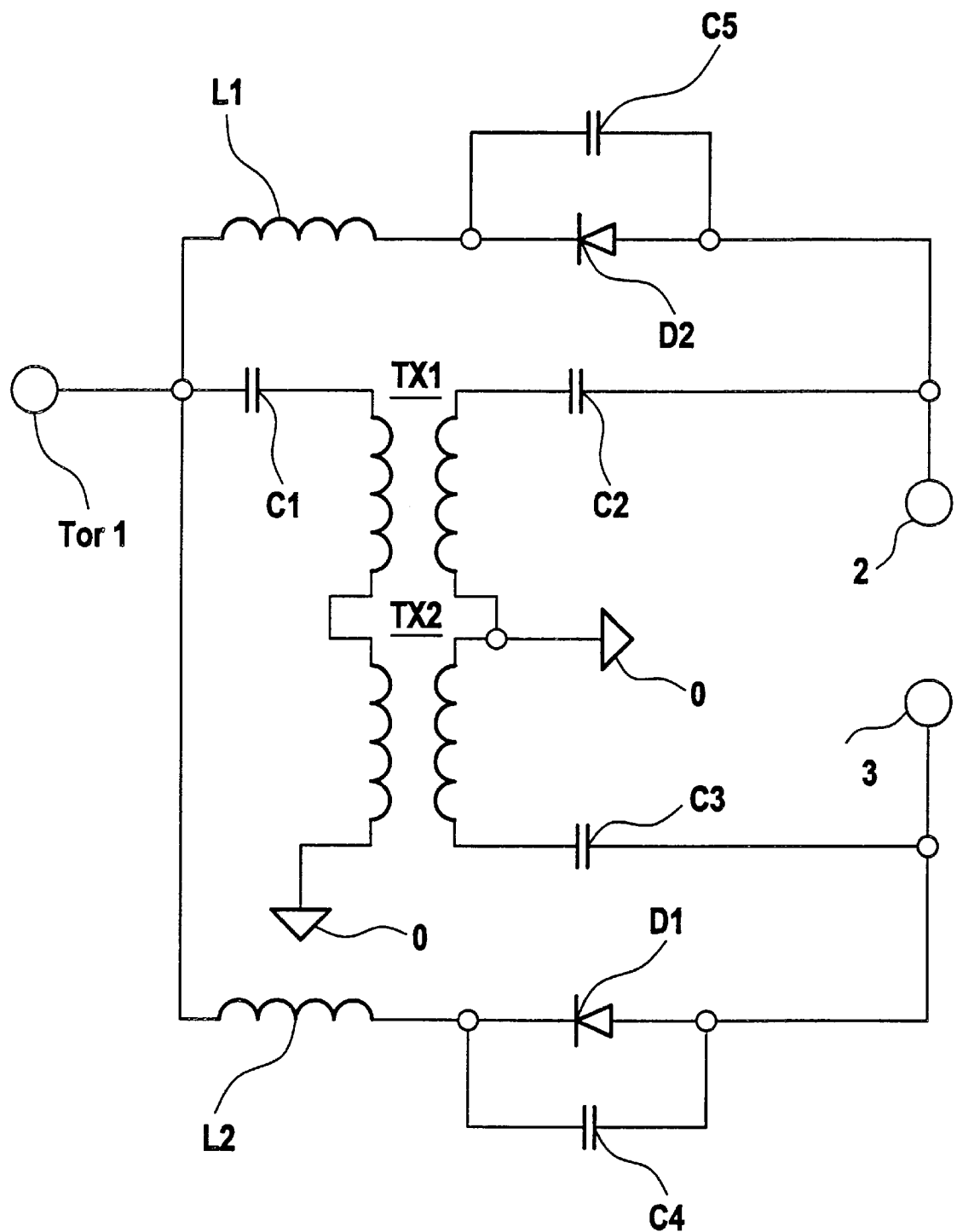
FIG. 1 is a diagram of the circuitry of a combiner-separator module in accordance with the present invention.

FIG. 1 illustrates a combiner-separator module that connects two unillustrated communications terminals to the same also unillustrated antenna in a combat vehicle. The module comprises a master gate 1 that connects to the antenna and two slave gates 2 and 3 that connect to the communications terminals. Gate 1 is connected to gates 2 and 3. Gate 1 is coupled to gates 2 and 3 by way of a transformer circuit TX1. One end of this circuit's primary coil is connected to gate 1 and its other end to zero potential. Both ends of the circuit's secondary coil are connected to either gate 2 or gate 3 and to zero potential at a branch TX2 at the midpoint. Gates 1, 2, and 3 are direct-current decoupled from transformer circuit TX1 by capacitors C1, C2, and C3.

Gate 1 is connected to gate 2 by way of a bypass that comprises a choking coil L1 and a diode D2. Diode D2 is poled toward gate 1 and has a capacitor C5 connected in parallel. Gate 1 is also connected to gate 3 by way of a bypass that comprises a choking coil L2 and a diode D1. Diode D1 is poled toward gate 1 and has a capacitor C4 connected in parallel.

The circuitry illustrated in FIG. 1 can easily be dimensioned to allow the combiner-separator module to transmit only frequencies of 2 to 220 MHz. Any direct-current signals arriving at one of the gates will be short-circuited due to inductivities toward mass potential.

The function of the overall circuitry illustrated in FIG. 1 can be optimized by dimensioning the separate components in accordance with a circuitry-simulation program. This approach will now be illustrated by way of example from empirical results. FIGS. 2 through 7 are graphs of signal-output ratios in dB over frequencies ranging from 0.3 to 100 MHz. The frequencies are plotted logarithmically.

Two particularly important frequencies are especially emphasized by arrows in all of the figures, 30 MHz by arrow 1 and 80 MHz by arrow 2.

Figure 2:
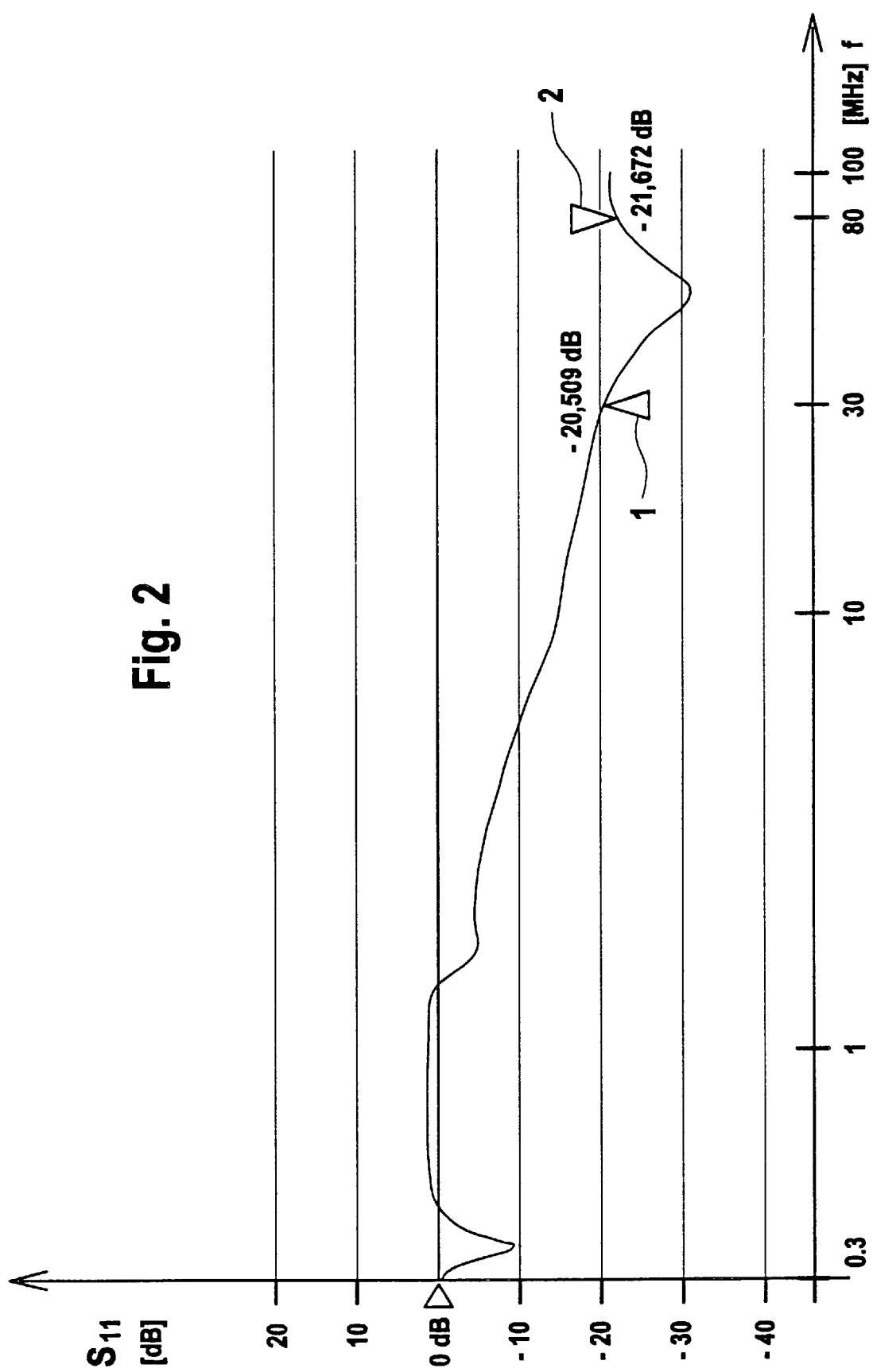
FIG. 2 is a graph of the signal-output ratio reflected by the gate 1 in the circuit illustrated in FIG. 1 over frequency.

FIG. 2 shows a signal $S_{11}$ reflected by gate 1 as a function of frequency. How weak this reflection is will be evident from the −20.509 dB at 30 MHz and the −21.672 dB at 80 MHz.

Figure 3:
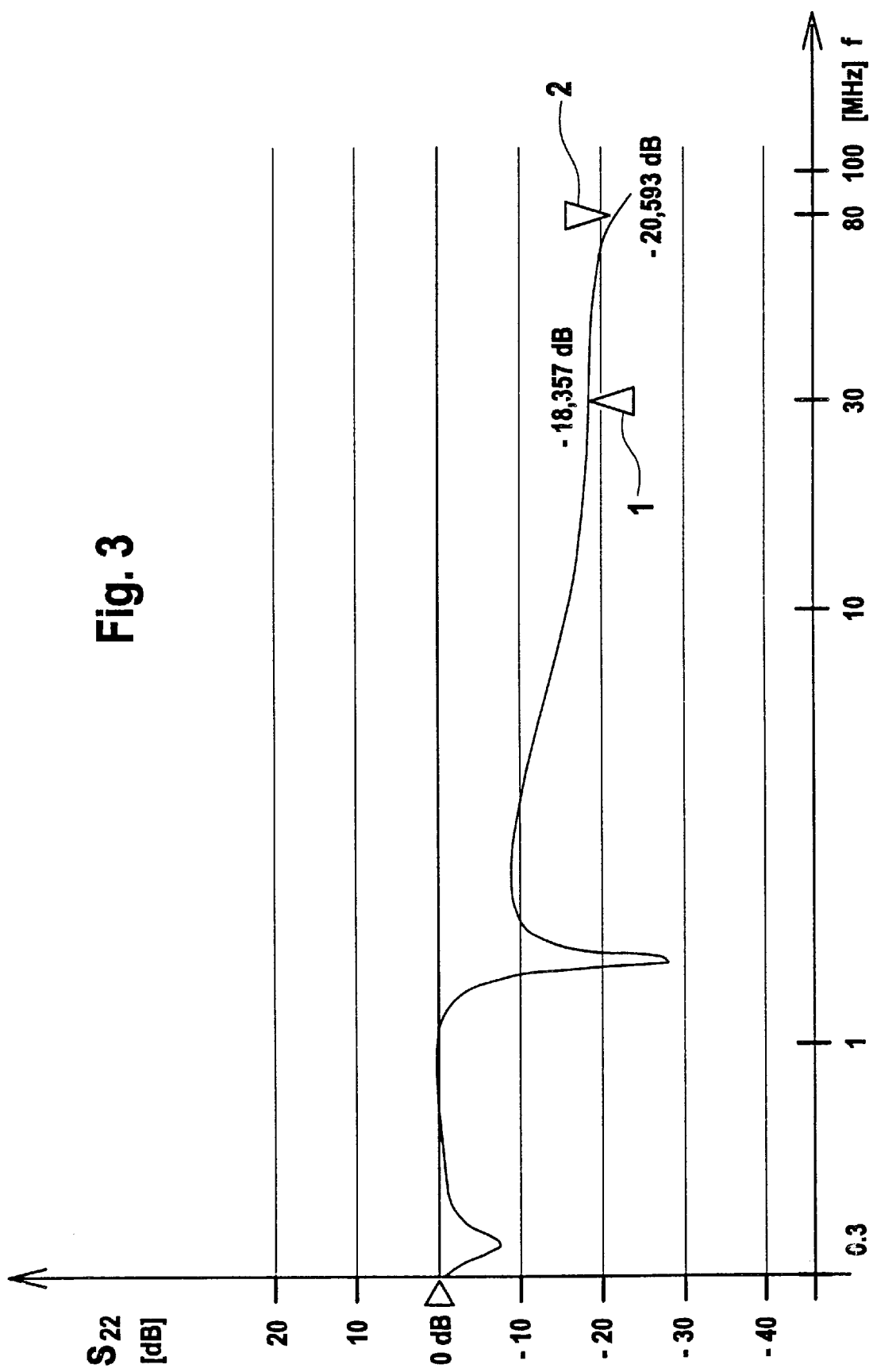
FIG. 3 is a graph similar to FIG. 2 of the signal-output ratio reflected by the circuit's gate 2.
Figure 4:
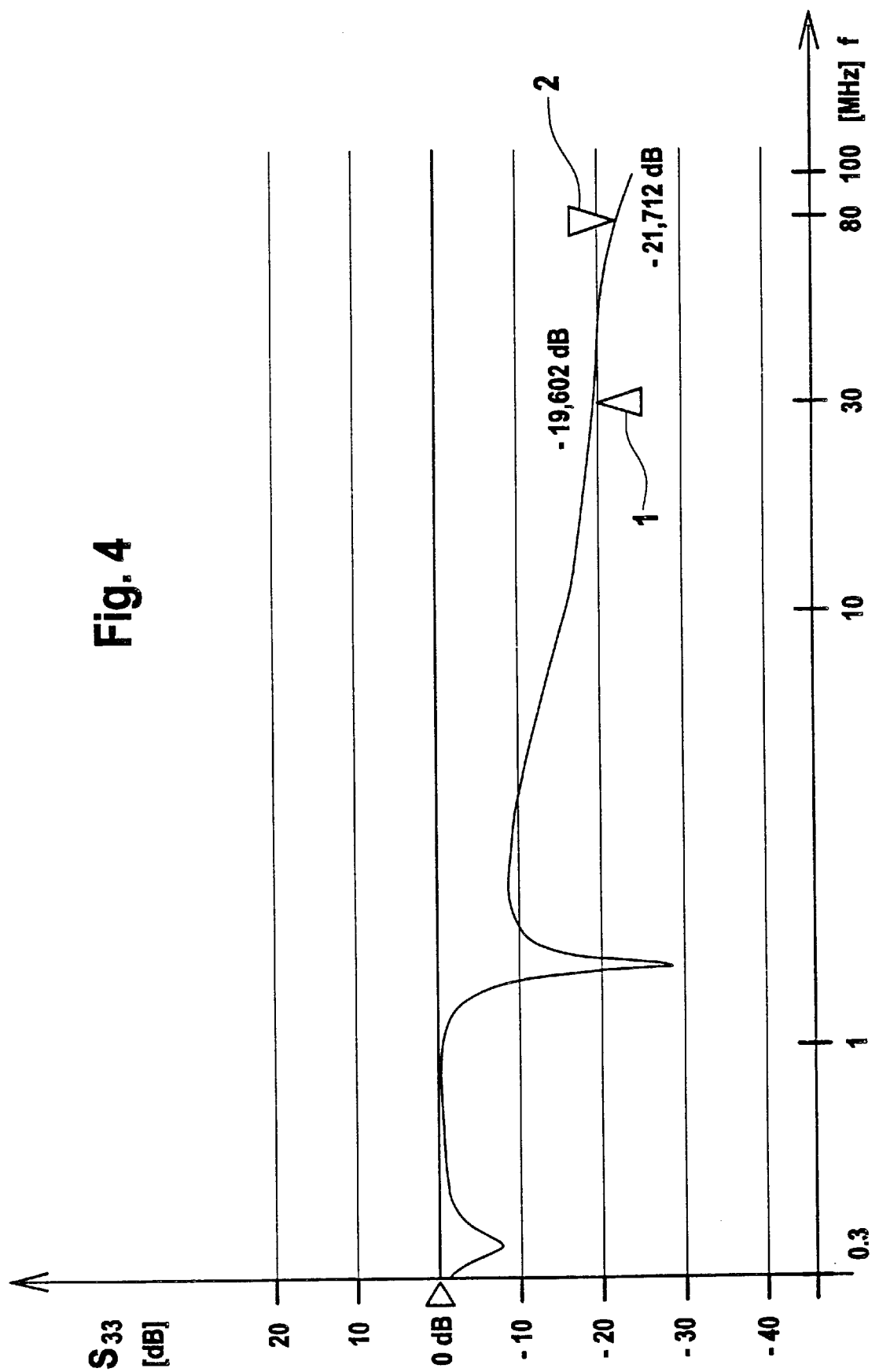
FIG. 4 is a graph similar to FIG. 2 of the signal ratio reflected by the circuit's gate 3.

The same is true of the signal outputs $S_{22}$ and $S_{33}$ reflected by gates 2 and 3 as illustrated in FIGS. 3 and 4. In FIG. 3 the level for 30 MHz is −18.357 dB and that for 80 MHz−20.593 dB. In FIG. 4 the level for 30 MHz is −19.602 dB and that for 80 MHz −21.712 dB.

Figure 5:
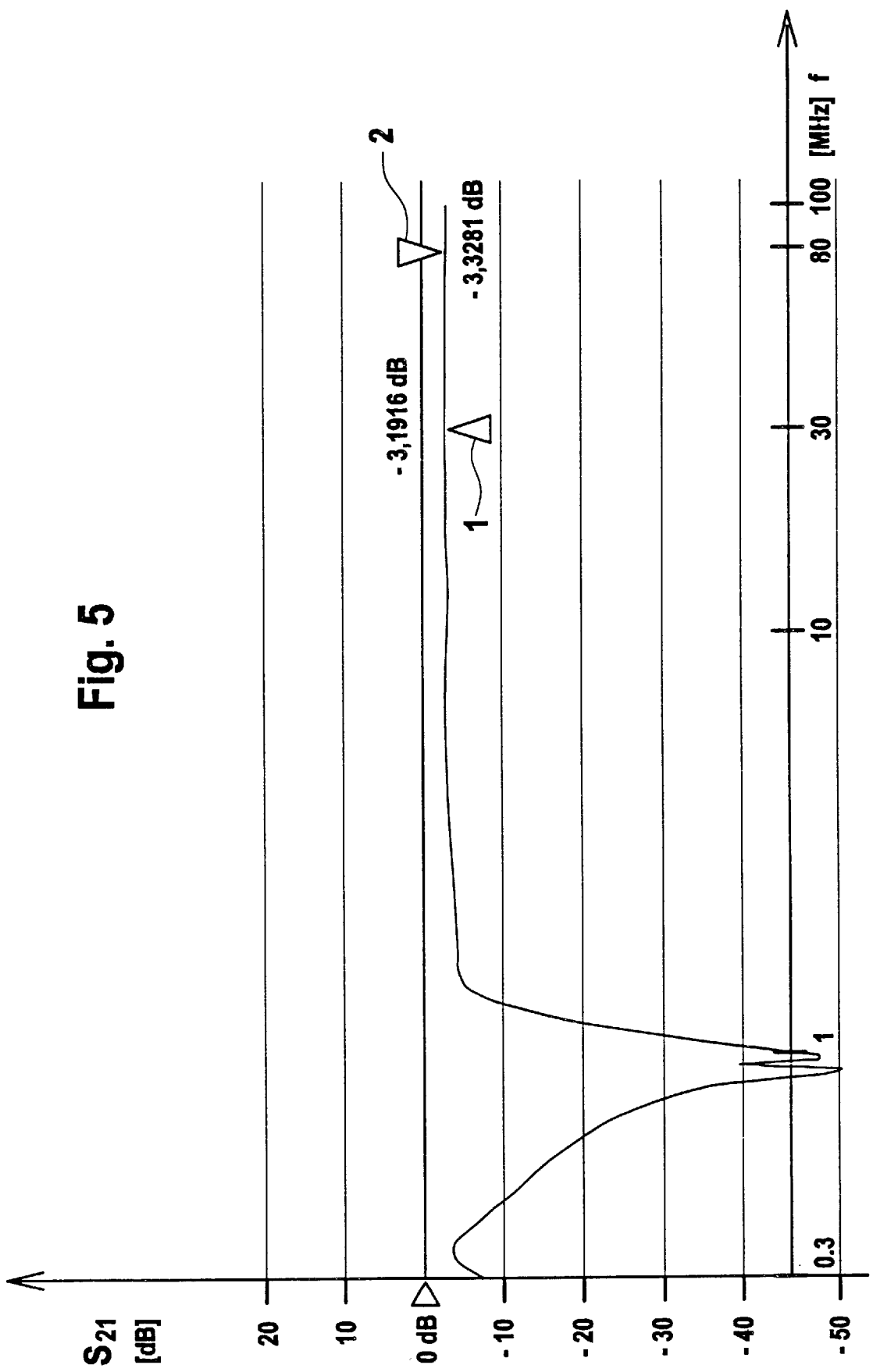
FIG. 5 is a graph similar to FIG. 2 of the ratio transmitted between gates 1 and 2.

FIG. 5 illustrates the signal output traveling between gates 1 and 2. It will be evident from the levels of −3.1916 db at 30 MHz and −3.3281 dB at 80 MHz that the transmission is very uniform throughout the frequency range.

Figure 6:
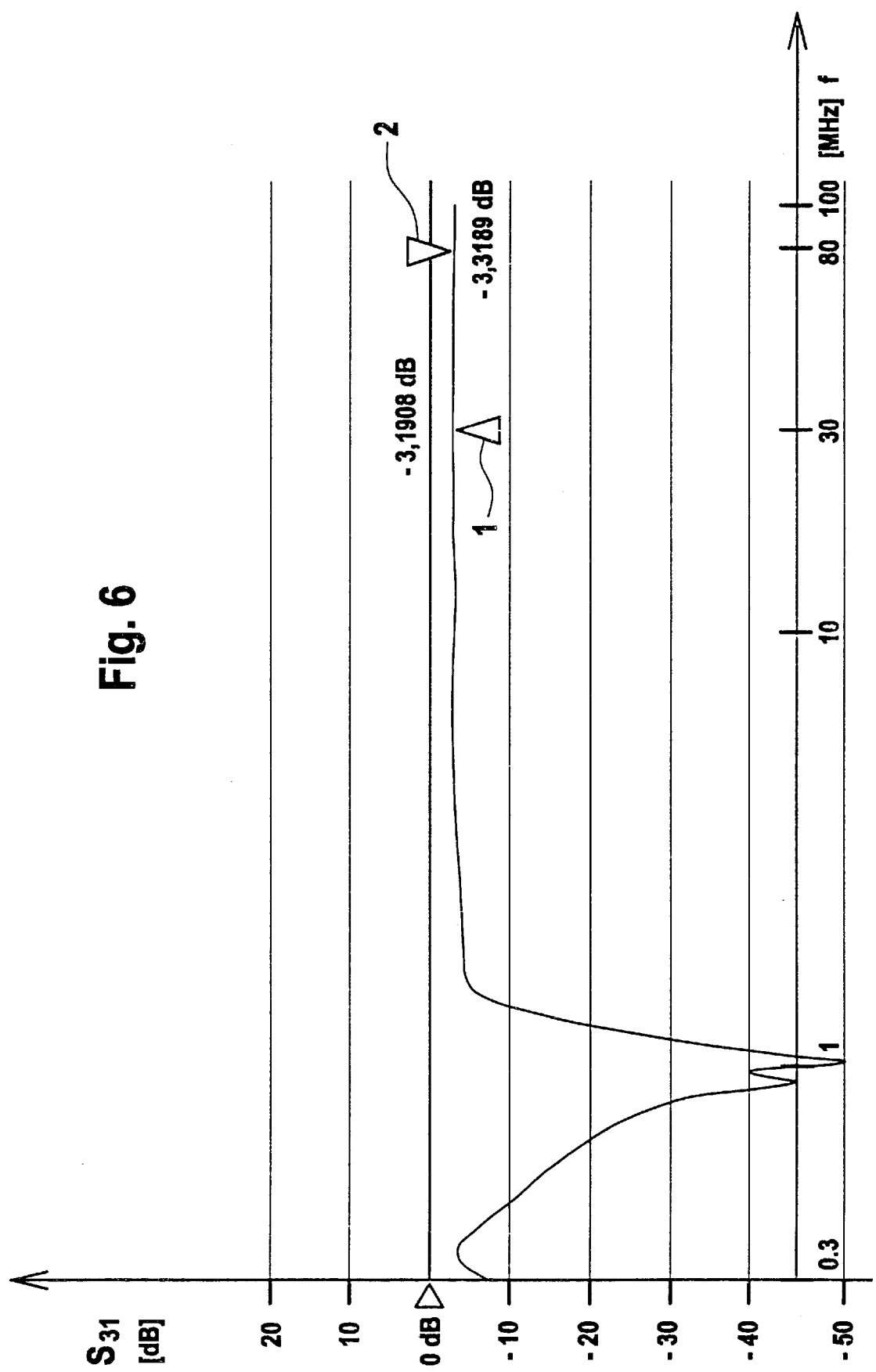
FIG. 6 is a graph similar to FIG. 2 of the ratio transmitted between gates 1 and 3.

FIG. 6, like FIG. 5, illustrates the transmission of signal output $S_{11}$ between gates 1 and 3. The levels of −3.1908 dB at 30 MHz and of −3.3189 dB at 80 MHz again reveal smooth transmission within the range, as well as, in conjunction with FIG. 5, a uniform distribution of the signal output between both branches of the combiner-separator module.

Figure 7:
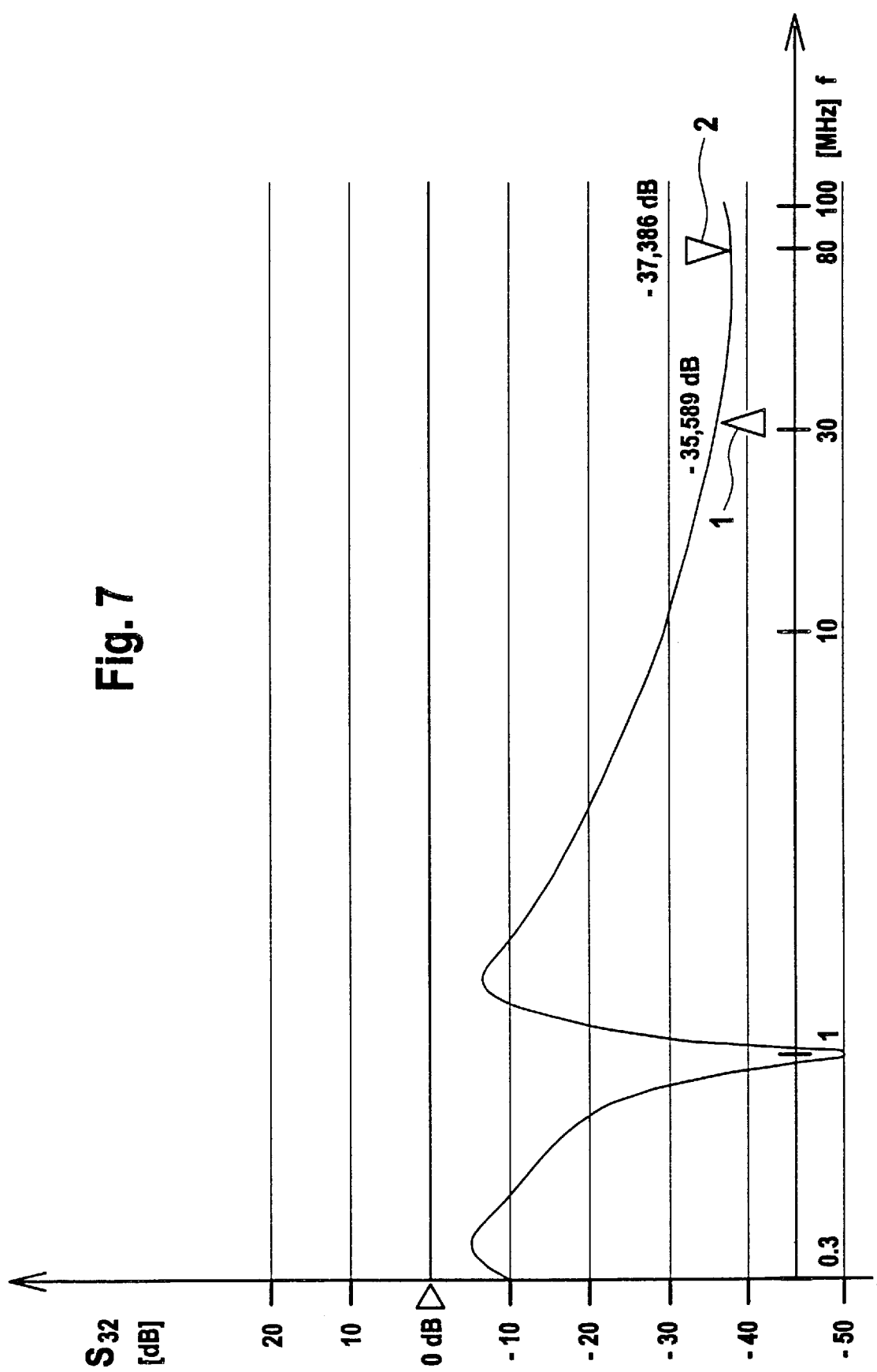
FIG. 7 is a graph similar to FIG. 2 of the ratio transmitted between gates 2 and 3.

FIG. 7 illustrates signal output $S_{32}$ as it travels between gates 2 and 3, the −35.589 dB at 30 MHz and the −37.386 dB at 80 MHz evidencing its weakness. The requirement that gates 2 and 3 be uncoupled is accordingly satisfied. The extreme minima that occur at 1 MHz can be ascribed to the action of the bypass and are outside the range relevant to transmission.

The results of the tests indicate that the combiner-separator module specified herein absolutely meets all expectations with respect to non-priority parallel exploitation of a single antenna, transmission of the desired frequency range, transmission of the requisite high-frequency output, decoupling of the radios' antenna input terminals, direct-current coupling of the antenna to the radios, and direct-current decoupling of the individual radios.

What is claimed is:

1. A device for decreasing the number of antennas on a combat vehicle that accommodates several communications terminals, comprising a combiner-separator module for coupling each pair of communications terminals to the same antenna, each module comprising one master gate for connecting the antenna and two slave gates for connecting the communications terminals, coupled by way of a transformer stage, wherein the gates are direct-current decoupled from the transformer stage and the master gate is connected to each slave gate by way of a bypass that transmits only a direct current and provides an antenna voltage.

2. The device as in claim 1, wherein the transformer stage comprises a transformer with one end of a primary coil connected to the master gate by way of a capacitor and another end connected to zero potential and with both ends of a secondary coil connected to one of the slave gates by way of a capacitor and to zero potential at a branch at the midpoint.

3. The device as in claim 1, wherein each bypass includes a choking coil and a diode poled toward the master gate and a capacitor connected in parallel with the diode.

4. The device as in claim 2, wherein each bypass includes a choking coil and a diode poled toward the master gate and a capacitor connected in parallel with the diode.

* * * * *

UNITED STATES PATENT AND TRADEMARK OFFICE
CERTIFICATE OF CORRECTION

PATENT NO. : 6,392,608 B2
DATED : May 21, 2002
INVENTOR(S) : Axel Scheibel

It is certified that error appears in the above-identified patent and that said Letters Patent is hereby corrected as shown below:

<u>Title page,</u>
Item [73], Assignee, change name of Assignee from: "Krauss-Maffei-Wegman GmbH & Co." to -- Krauss-Maffei_Wegmann GmbH & Co. --; and
Change Place of Residence from: "Kasell" to -- Kasel --

Signed and Sealed this

Twenty-seventh Day of August, 2002

*Attest:*

JAMES E. ROGAN
*Attesting Officer*  *Director of the United States Patent and Trademark Office*